United States Patent
Pal et al.

(10) Patent No.: US 8,987,748 B2
(45) Date of Patent: Mar. 24, 2015

(54) DRAIN INDUCED BARRIER LOWERING WITH ANTI-PUNCH-THROUGH IMPLANT

(71) Applicant: Texas Instruments Incorporated, Dallas, TX (US)

(72) Inventors: Himadri Sekhar Pal, Allen, TX (US); Youn Sung Choi, Allen, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 13/719,511

(22) Filed: Dec. 19, 2012

(65) Prior Publication Data

US 2013/0161639 A1  Jun. 27, 2013

Related U.S. Application Data

(60) Provisional application No. 61/578,359, filed on Dec. 21, 2011.

(51) Int. Cl.
*H01L 29/78* (2006.01)
*H01L 29/66* (2006.01)
*H01L 21/8238* (2006.01)

(52) U.S. Cl.
CPC ...... *H01L 29/7835* (2013.01); *H01L 29/66477* (2013.01); *H01L 21/823814* (2013.01); *H01L 29/7848* (2013.01); *H01L 21/823807* (2013.01); *H01L 21/823892* (2013.01)
USPC .......................................................... 257/76

(58) Field of Classification Search
CPC .................................................. H01L 29/7835
See application file for complete search history.

(56) References Cited

U.S. PATENT DOCUMENTS

| | | | |
|---|---|---|---|
| 2002/0110988 A1* | 8/2002 | Yeh et al. | 438/311 |
| 2007/0205468 A1* | 9/2007 | Yeo et al. | 257/371 |
| 2009/0224337 A1* | 9/2009 | Yu et al. | 257/408 |

* cited by examiner

*Primary Examiner* — Fernando L Toledo
*Assistant Examiner* — Valerie N Newton
(74) *Attorney, Agent, or Firm* — Jacqueline J. Garner; Frederick J. Telecky, Jr.

(57) ABSTRACT

An integrated circuit containing an MOS transistor with epitaxial source and drain regions may be formed by implanting a retrograde anti-punch-through layer prior to etching the source drain regions for epitaxial replacement. The anti-punch-through layer is disposed between stressor tips of the epitaxial source and drain regions, and does not substantially extend into the epitaxial source and drain regions.

20 Claims, 15 Drawing Sheets

DRAIN INDUCED BARRIER LOWERING WITH ANTI-PUNCH-THROUGH IMPLANT

CROSS-REFERENCE TO RELATED APPLICATIONS

This application claims the benefit of priority under U.S.C. §119(e) of U.S. Provisional Application 61/578,359, filed Dec. 21, 2011).

FIELD OF THE INVENTION

This invention relates to the field of integrated circuits. More particularly, this invention relates to MOS transistors in integrated circuits.

BACKGROUND OF THE INVENTION

MOS transistors may be formed with epitaxial source and drain regions which extend toward each other in the substrate, so that the source and drain regions have a minimum separation at stressor tips in the substrate at a depth of 40 to 70 nanometers below the gate dielectric layer. These MOS transistors may have leakage currents higher than a desired value, due to leakage currents between the source and drain at the minimum separation. Such leakage currents may be included in drain induced barrier lowering.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an MOS transistor with epitaxial source and drain regions may be formed by implanting an anti-punch-through layer prior to etching the source drain regions for epitaxial replacement. The anti-punch-through layer is disposed between stressor tips of the epitaxial source and drain regions, and does not substantially extend into the epitaxial source and drain regions. The anti-punch-through implant may provide a desired retrograde doping density distribution under a gate of the MOS transistor, so that a threshold adjustment implant dose may be reduced or eliminated, and a halo implant dose may be reduced or eliminated. Threshold uniformity may be improved by the retrograde doping density distribution. Formation of the anti-punch-through layers in MOS transistors may desirably reduce off-state leakage currents and reduce variation in threshold voltages. Implanting the anti-punch-through layer prior to etching the source drain regions may advantageously reduce counterdoping of the source and drain regions compared to other methods of forming an anti-punch-through layer. Both an n-channel metal oxide semiconductor (NMOS) transistor and a p-channel metal oxide semiconductor (PMOS) transistor may be formed according to the instant invention.

DETAILED DESCRIPTION OF EXAMPLE EMBODIMENTS

Figure 1A:
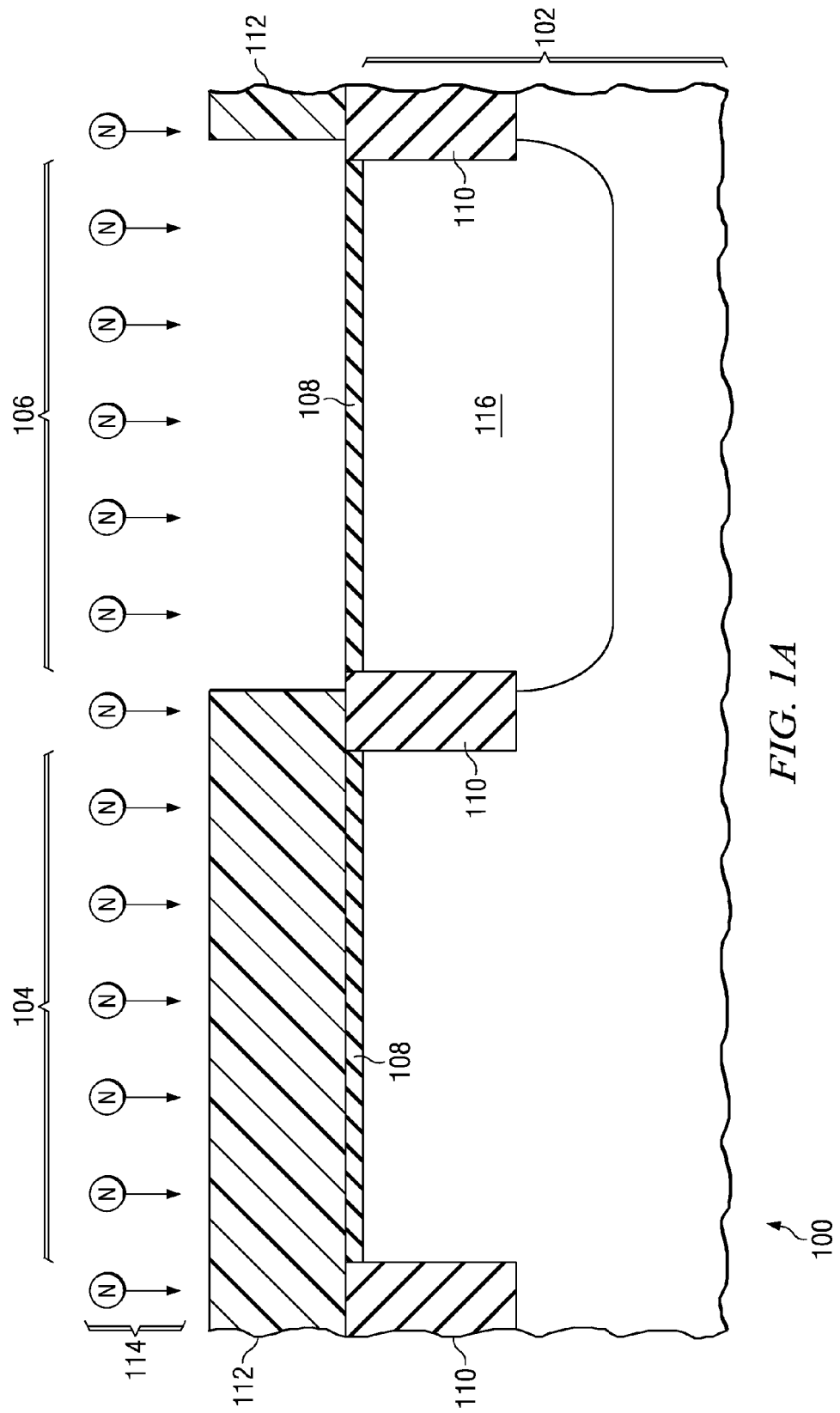
FIG. 1A through FIG. 1O are cross sections of an integrated circuit containing an NMOS transistor and a PMOS transistor formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an MOS transistor with epitaxial source and drain regions may be formed by implanting an anti-punch-through layer prior to etching source drain regions for epitaxial replacement. The anti-punch-through layer is disposed between stressor tips of the epitaxial source and drain regions, and does not substantially extend into the epitaxial source and drain regions. The anti-punch-through implant may provide a desired retrograde doping density distribution under a gate of the MOS transistor, so that a threshold adjustment implant dose may be reduced or eliminated, and a halo implant dose may be reduced or eliminated. Threshold uniformity may be improved by the retrograde doping density distribution. Formation of the anti-punch-through layers in MOS transistors may desirably reduce off-state leakage currents and reduce variation in threshold voltages. Implanting the anti-punch-through layer prior to etching the source drain regions may advantageously reduce counterdoping of the source and drain regions compared to other methods of forming an anti-punch-through layer. Both an n-channel metal oxide semiconductor (NMOS) transistor and a p-channel metal oxide semiconductor (PMOS) transistor may be formed according to the instant invention.

FIG. 1A through FIG. 1O are cross sections of an integrated circuit containing an NMOS transistor and a PMOS transistor formed according to an embodiment, depicted in successive stages of fabrication. The integrated circuit 100 is formed in and on a silicon-containing semiconductor substrate 102, for example a single crystal silicon wafer, a silicon-on-insulator (SOI) wafer, or a hybrid orientation technology (HOT) wafer with regions of different crystal orientations. The integrated circuit 100 includes an NMOS area 104 defined for the NMOS transistor and a PMOS area 106 defined for the PMOS transistor.

A layer of sacrificial silicon oxide 108 2 to 20 nanometers thick may be formed at a top surface of the substrate 102, for example by thermal oxidation of the substrate 102 in an oxygen ambient. Elements of field oxide 110 are formed at a top surface of the substrate 102, including silicon dioxide between 200 and 300 nanometers thick, for example by shallow trench isolation (STI) or local oxidation of silicon (LOCOS) processes.

An STI process may include the steps of: forming an oxide layer on the substrate 102, forming a silicon nitride layer on the oxide layer, patterning the silicon nitride layer so as to expose an area for the field oxide 110, etching a trench in the substrate 102 in the exposed area to an appropriate depth for a desired thickness of the field oxide 110, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer.

A LOCOS process may include the steps of: forming an oxide layer on the substrate 102, forming a silicon nitride layer on the oxide layer, patterning the silicon nitride layer so as to expose an area for the field oxide 110, growing thermal oxide at the top surface of the substrate 102 in the exposed area to an appropriate thickness for a desired thickness of the field oxide 110, and removing the silicon nitride layer.

An n-well implant mask 112 is formed over the substrate 102 so as to expose the PMOS area 106. The n-well implant mask 112 may include, for example, 400 to 600 nanometers of photoresist. An n-well implant operation is performed which ion implants n-type n-well dopants 114, for example phosphorus, into the substrate 102 in the PMOS area 106 at dose of $1 \cdot 10^{13}$ to $1 \cdot 10^{14}$ atoms/cm$^2$ and an energy of 300 to 375 keV, to form an n-well implanted region 116. The n-well implant operation may also include implanting n-type channel stop dopants such as phosphorus at dose of $3 \cdot 10^{12}$ to $3 \cdot 10^{13}$ atoms/cm$^2$ and an energy of 200 to 250 keV, to form an n-type channel stop implanted layer, not shown, aligned with a bottom of the field oxide 110.

Figure 1B:
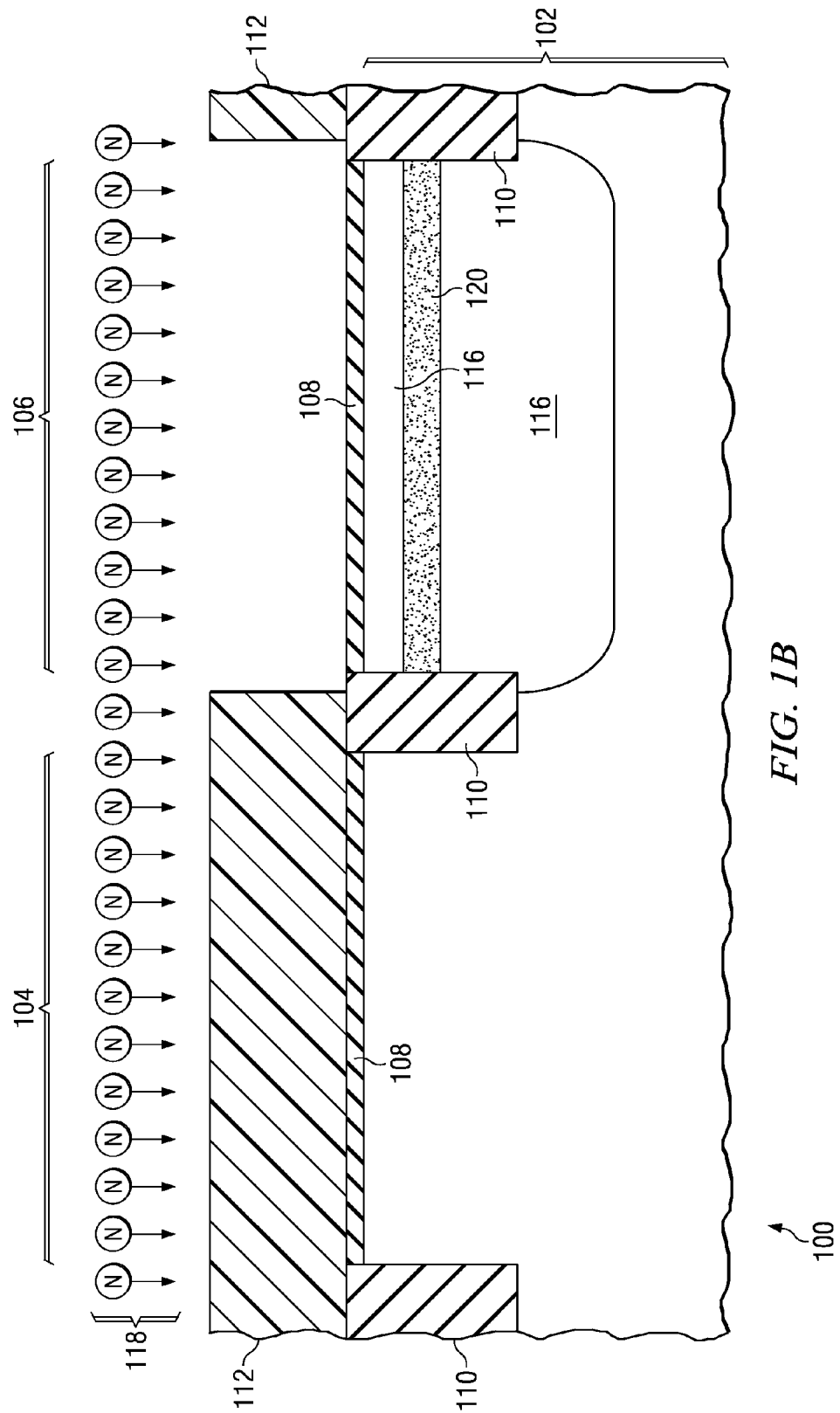

Referring to FIG. 1B, a PMOS anti-punch-through implant operation is performed which implants n-type PMOS anti-punch-through dopants 118, for example antimony at dose of $3 \cdot 10^{13}$ to $3 \cdot 10^{14}$ atoms/cm$^2$ and an energy of 65 to 140 keV, into the substrate 102 in the PMOS area 106, to form a PMOS anti-punch-through implanted layer 120 disposed 40 to 70 nanometers below the top surface of the substrate 102. In one version of the instant embodiment, a peak doping density of the PMOS anti-punch-through dopants 118 may be at least two times as high as a doping density at the top surface of the substrate 102 in the PMOS area 106, so as to provide a desired threshold voltage of the PMOS transistor.

In some versions of the instant embodiment, the n-type PMOS anti-punch-through dopants 118 may include arsenic, and possibly phosphorus. Antimony may be preferable due to a lower implanted range straggle and a lower diffusivity in silicon, compared to arsenic and phosphorus. The PMOS anti-punch-through implanted layer 120 is depicted in FIG. 1B with a stipple pattern. In one version of the instant embodiment, the n-well implant mask 112 may be used as an implant mask for the PMOS anti-punch-through implant operation.

Figure 1C:
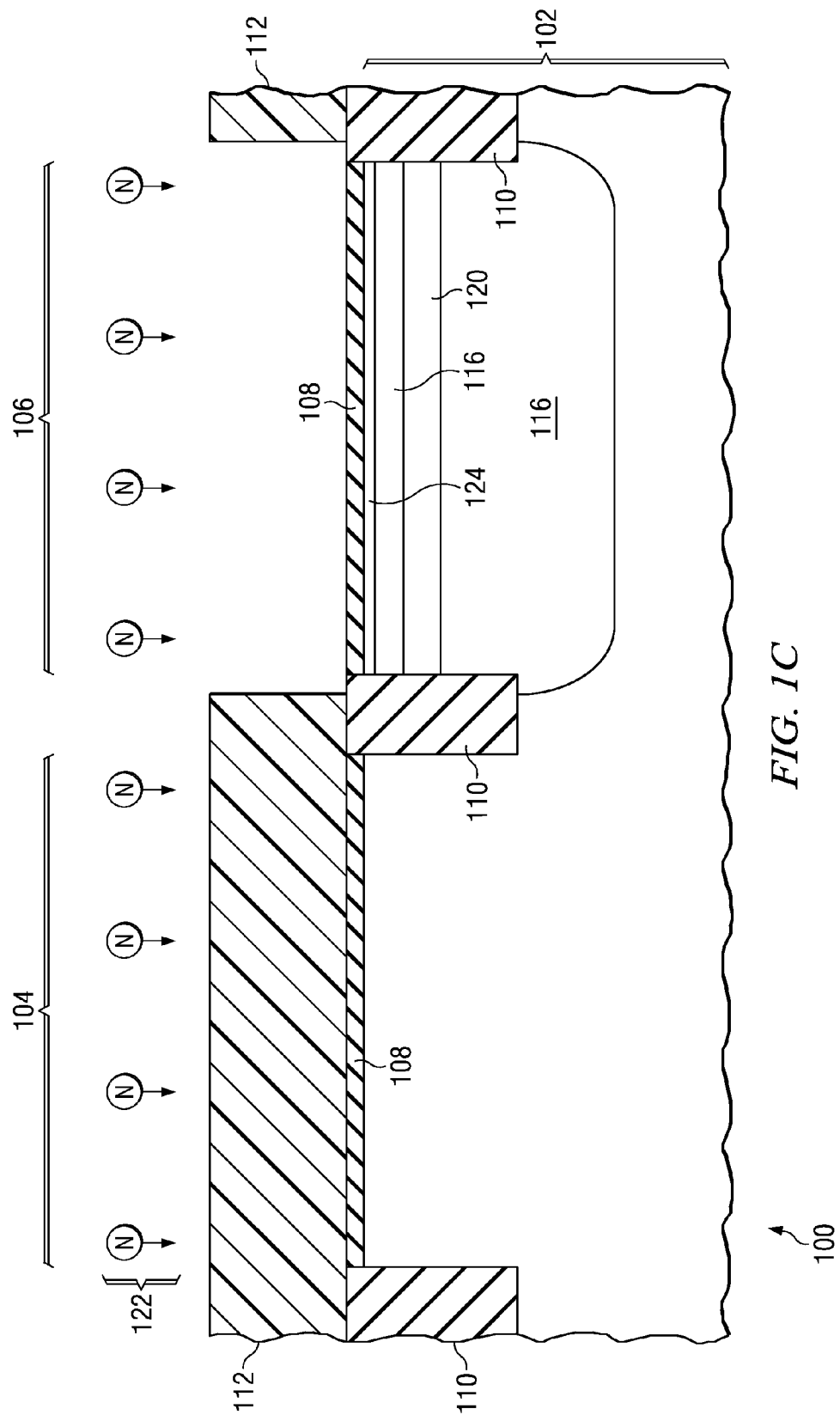

Referring to FIG. 1C, an optional PMOS threshold adjustment implant operation may be performed which implants n-type PMOS threshold adjustment dopants 122 such as phosphorus at 25 keV, and/or arsenic at 40 keV, and possibly antimony at 50 keV, into the substrate 102 in the PMOS area 106 to form a PMOS threshold adjustment implanted layer 124 at the top surface of the substrate 102 in the PMOS area 106. The PMOS threshold adjustment implant operation may use the n-well implant mask 112 as an implant mask. In one version of the instant embodiment, the PMOS anti-punch-through dopants 118 in the PMOS anti-punch-through implanted layer 120 may provide a majority of a desired retrograde dopant density distribution for a desired threshold voltage for the PMOS transistor, so that a total dose of the PMOS threshold adjustment dopants 122 may be less than $5 \cdot 10^{11}$ atoms/cm$^2$. In an alternate version of the instant embodiment, the PMOS anti-punch-through dopants 118 in the PMOS anti-punch-through implanted layer 120 may provide all of the desired retrograde dopant density distribution for the desired threshold voltage for the PMOS transistor, so that the PMOS threshold adjustment implant operation is not performed.

Figure 1D:
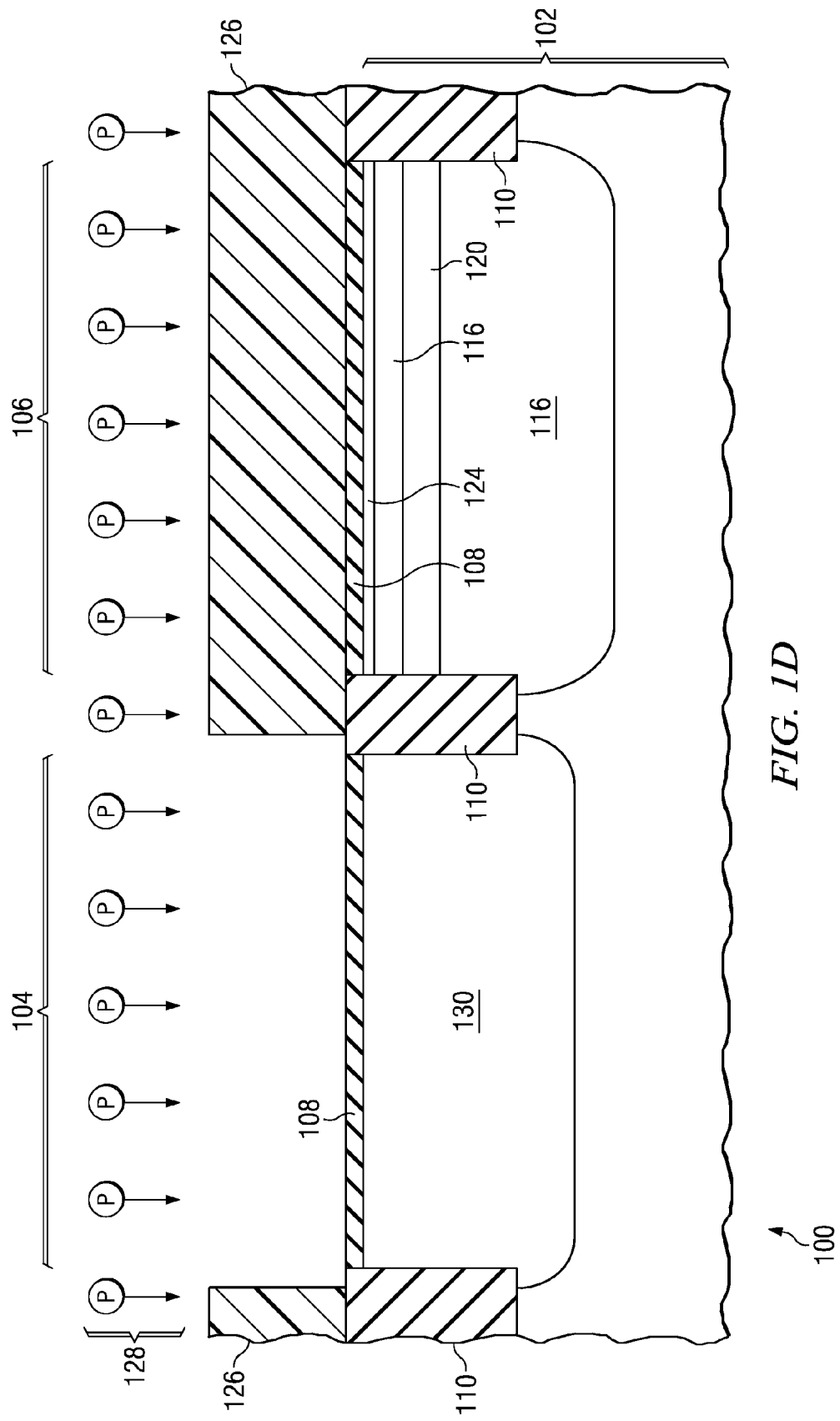

Referring to FIG. 1D, a p-well implant mask 126 is formed over the substrate 102 so as to expose the NMOS area 104. The p-well implant mask 126 may include, for example, 350 to 550 nanometers of photoresist. A p-well implant operation is performed which ion implants p-type p-well dopants 128, for example boron, into the substrate 102 in the NMOS area 104 at dose of $1 \cdot 10^{13}$ to $1 \cdot 10^{14}$ atoms/cm$^2$ and an energy of 150 to 190 keV, to form a p-well implanted region 130. The p-well implant operation may also include implanting p-type channel stop dopants such as boron at dose of $3 \cdot 10^{12}$ to $3 \cdot 10^{13}$ atoms/cm$^2$ and an energy of 90 to 120 keV, to form a p-type channel stop implanted layer, not shown, aligned with a bottom of the field oxide 110.

Figure 1E:
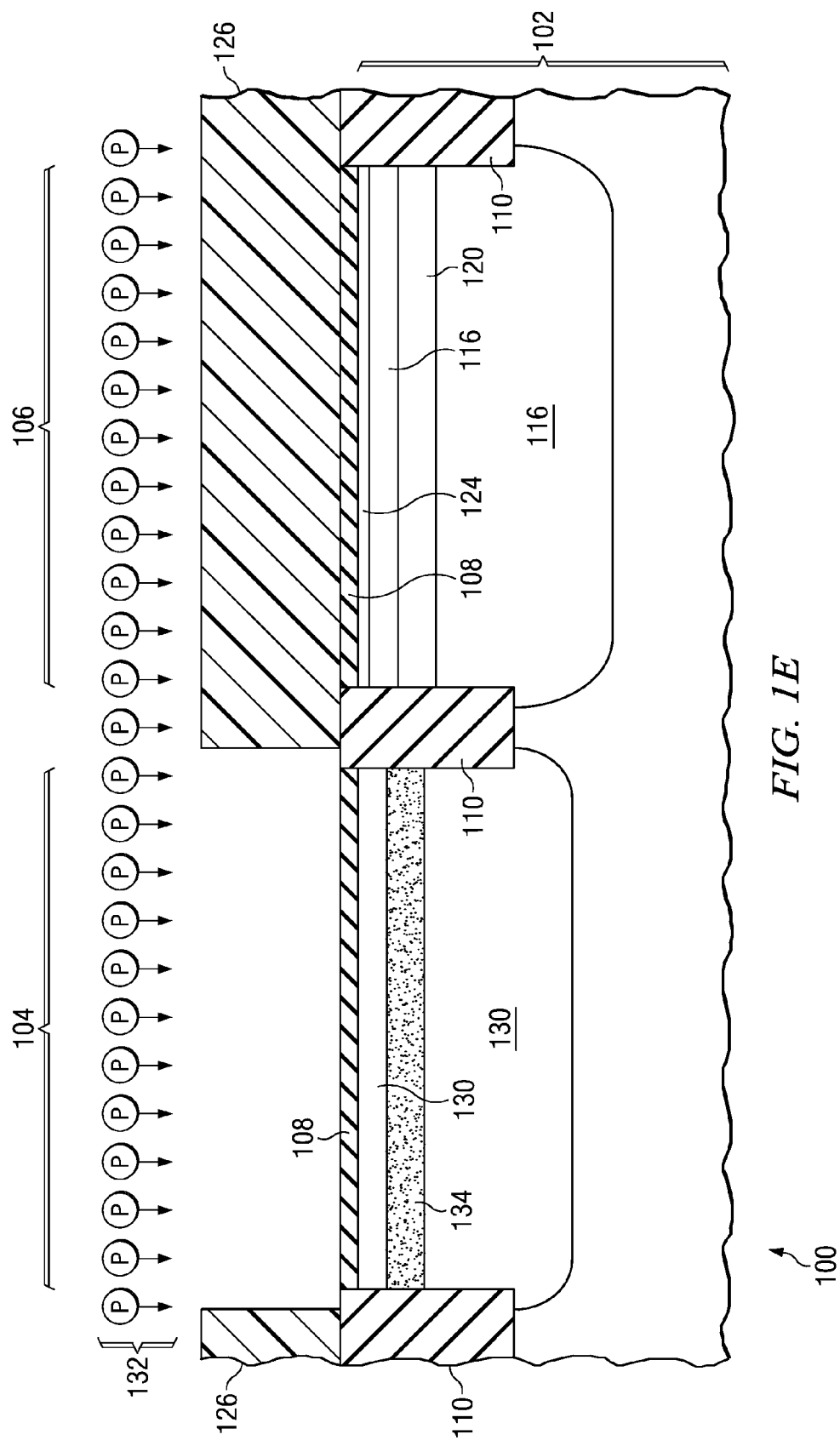

Referring to FIG. 1E, an NMOS anti-punch-through implant operation is performed which implants p-type NMOS anti-punch-through dopants 132, for example indium at dose of $3 \cdot 10^{13}$ to $3 \cdot 10^{14}$ atoms/cm$^2$ and an energy of 65 to 140 keV, into the substrate 102 in the NMOS area 104, to form an NMOS anti-punch-through implanted layer 134 disposed 40 to 70 nanometers below the top surface of the substrate 102. In one version of the instant embodiment, a peak doping density of the NMOS anti-punch-through dopants 132 may be at least two times as high as a doping density at the top surface of the substrate 102 in the NMOS area 104, so as to provide a desired threshold voltage of the NMOS transistor.

In some versions of the instant embodiment, the p-type NMOS anti-punch-through dopants 132 may include gallium, and possibly boron. Indium may be preferable due to a lower implanted range straggle and a lower diffusivity in silicon, compared to gallium and boron. The NMOS anti-punch-through implanted layer 134 is depicted in FIG. 1E with a stipple pattern. In one version of the instant embodiment, the p-well implant mask 126 may be used as an implant mask for the NMOS anti-punch-through implant operation.

Figure 1F:
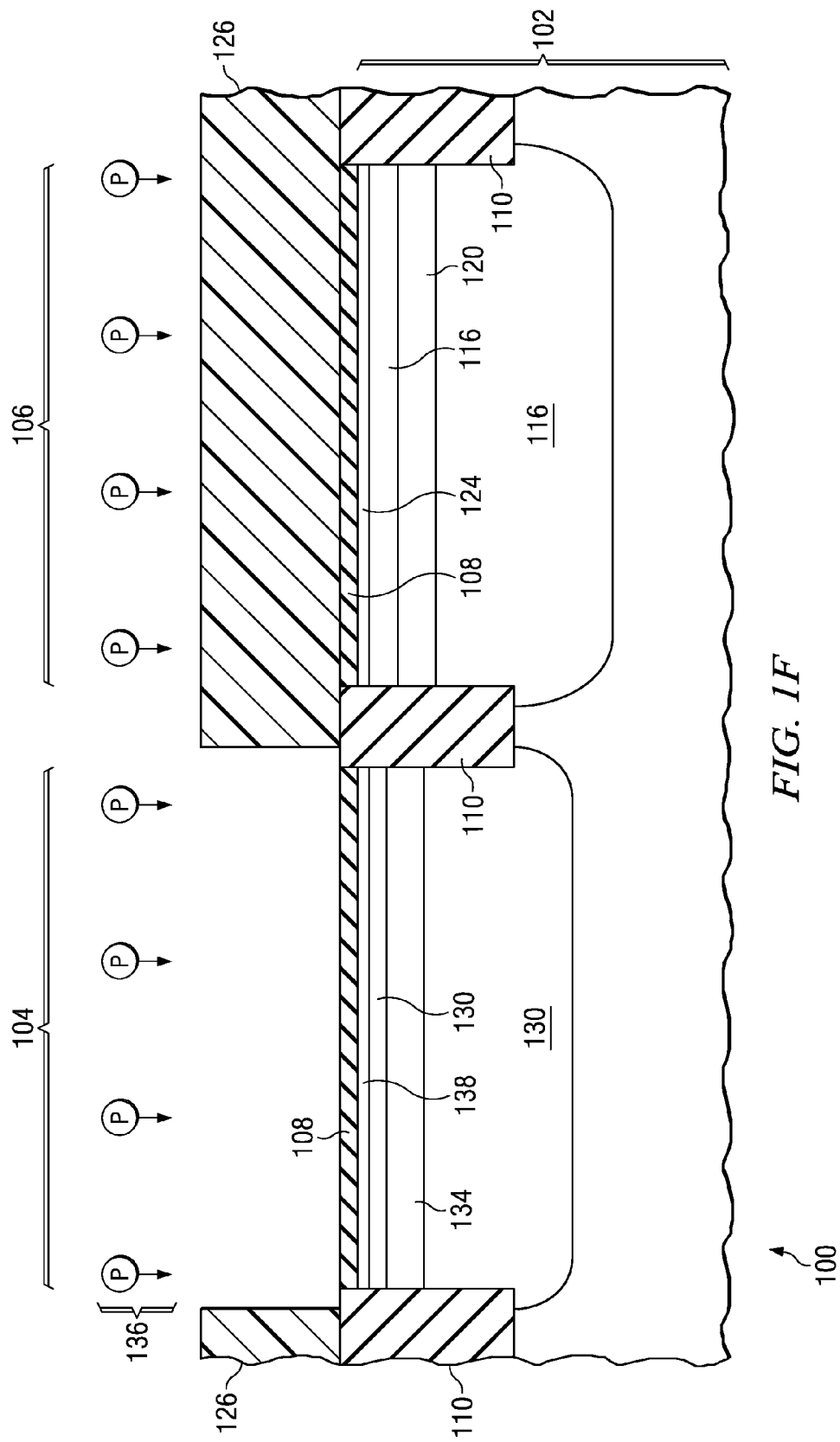

Referring to FIG. 1F, an optional NMOS threshold adjustment implant operation may be performed which implants p-type NMOS threshold adjustment dopants 136 such as indium at 90 keV, and possibly gallium at 70 keV, into the substrate 102 in the NMOS area 104 to form an NMOS threshold adjustment implanted layer 138 at the top surface of the substrate 102. The NMOS threshold adjustment implant operation may use the p-well implant mask 126 as an implant mask. In one version of the instant embodiment, the NMOS anti-punch-through dopants 132 in the NMOS anti-punch-through implanted layer 134 may provide a majority of a desired dopant density distribution for a desired threshold voltage for the NMOS transistor, so that a total dose of the NMOS threshold adjustment dopants 136 may be less than $2 \cdot 10^{12}$ atoms/cm$^2$. In an alternate version of the instant embodiment, the NMOS anti-punch-through dopants 132 in the NMOS anti-punch-through implanted layer 134 may provide all of the desired dopant density distribution for the desired threshold voltage for the NMOS transistor, so that the NMOS threshold adjustment implant operation is not performed.

Figure 1G:
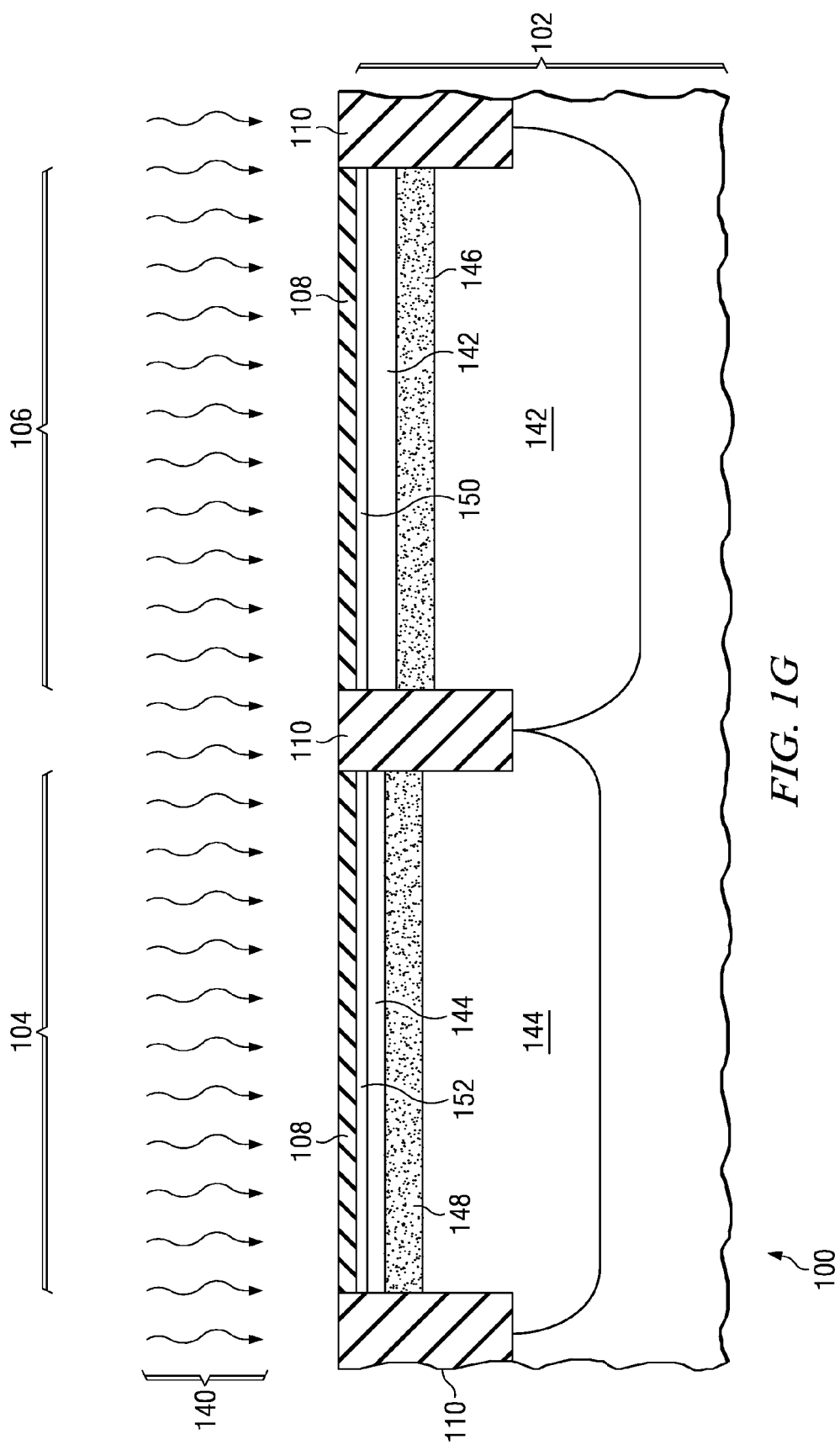

Referring to FIG. 1G, a well anneal operation 140 is performed which repairs lattice defects introduced by the implanted dopants described in reference to FIG. 1A through FIG. 1F and activates the implanted dopants. The well anneal operation 140 activates the n-well dopants 114 in the n-well implanted region 116 and the p-well dopants 128 in the p-well implanted region 130 to form an n-well 142 in the substrate 102 in the PMOS area 106 and a p-well 144 in the substrate 102 in the NMOS area 104, respectively. The well anneal operation 140 also activates the PMOS anti-punch-through dopants 118 in the PMOS anti-punch-through implanted layer 120 and the NMOS anti-punch-through dopants 132 in the NMOS anti-punch-through implanted layer 134 to form a PMOS anti-punch-through layer 146 centered 40 to 70 nanometers deep in the substrate 102 in the PMOS area 106 and an NMOS anti-punch-through layer 148 centered 40 to 70 nanometers deep in the substrate 102 in the NMOS area 104, respectively. The PMOS anti-punch-through layer 146 and the NMOS anti-punch-through layer 148 are depicted in FIG. 1G with a stipple pattern. The well anneal operation 140 further activates the PMOS threshold adjustment dopants 122 in the PMOS threshold adjustment implanted layer 124, if formed, and the NMOS threshold adjustment dopants 136 in the NMOS threshold adjustment implanted layer 138, if formed, to form a PMOS threshold adjustment layer 150 at the top surface of the substrate 102 in the PMOS area 106 and an NMOS threshold adjustment layer 152 at the top surface of the substrate 102 in the NMOS area 104, respectively.

In one version of the instant embodiment, the well anneal operation 140 may, for example, heat the substrate 102 using radiant energy in a laser anneal tool at temperature/time combinations from 1250° C. to 1350° C. for 100 microseconds to 1000° C. for 10 milliseconds. Annealing the substrate 102 in short times such as used in a laser anneal tool may desirably reduce growth of defect clusters from the implant lattice dislocations before the lattice damage is repaired by the well anneal operation 140.

In another version of the instant embodiment, the well anneal operation 140 may, for example, heat the substrate 102 using radiant energy in a spike anneal tool at temperature/time combinations from 1100° C. for 500 milliseconds to 1050° C. for 2 seconds.

In a further version, the well anneal operation 140 may, for example, heat the substrate 102 using radiant energy in a rapid thermal processor at 1050° C. for 30 seconds or equivalent anneal conditions, for example, 1075° C. for 15 seconds, or 1000° C. for 120 seconds.

An average doping density of the PMOS anti-punch-through layer 146 is $3·10^{18}$ to $3·10^{20}$ atoms/cm$^3$. Forming the PMOS anti-punch-through layer 146 to have an average doping density of $3·10^{18}$ to $3·10^{20}$ atoms/cm$^3$ provides a desired reduction in off-state leakage current of the PMOS transistor. In one version of the instant embodiment, at least 90 percent of the PMOS anti-punch-through dopants 118 may be disposed in the PMOS anti-punch-through layer 146 wherein a thickness of the PMOS anti-punch-through layer 146 is less than one third of a depth of the PMOS anti-punch-through layer 146. Similarly, an average doping density of the NMOS anti-punch-through layer 148 is $3·10^{18}$ to $3·10^{20}$ atoms/cm$^3$. Forming the NMOS anti-punch-through layer 146 to have an average doping density of $3·10^{18}$ to $3·10^{20}$ atoms/cm$^3$ provides a desired reduction in off-state leakage current of the NMOS transistor. In one version of the instant embodiment, at least 90 percent of the NMOS anti-punch-through dopants 132 are disposed in the NMOS anti-punch-through layer 148 wherein a thickness of the NMOS anti-punch-through layer 148 is less than one third of a depth of the NMOS anti-punch-through layer 148.

Figure 1H:
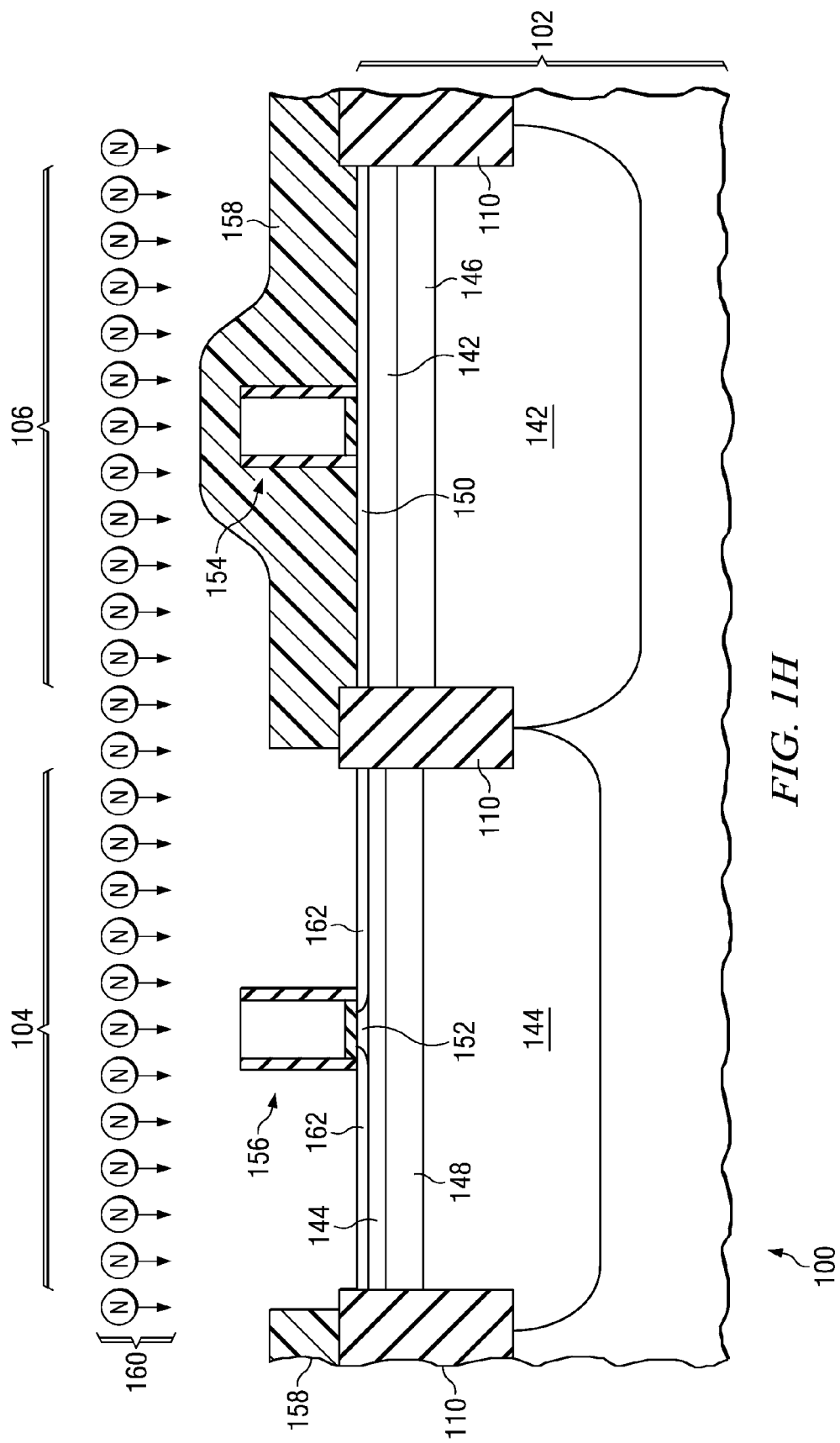

Referring to FIG. 1H, a PMOS gate structure 154 and an NMOS gate structure 156 are formed over the substrate 102 in the PMOS area 106 and the NMOS area 104, respectively. The PMOS gate structure 154 includes a gate dielectric layer on the substrate 102 and a gate electrode over the gate dielectric layer, and may include dielectric offset layers on lateral surfaces of the gate electrode, and similarly for the NMOS gate structure 156. An n-channel lightly doped drain (NLDD) implant mask 158 is formed over the substrate and the PMOS gate structure 154 so as to expose the substrate 102 in the NMOS area 104 adjacent to the NMOS gate structure 156. An NLDD implant operation is performed which ion implants n-type NLDD dopants 160, for example arsenic at a dose of $3·10^{14}$ to $2·10^{15}$ atoms/cm$^2$ at an energy of 1.5 to 2.5 keV, into the substrate 102 adjacent to the NMOS gate structure 156 to form NLDD implanted layers 162.

Figure 1I:
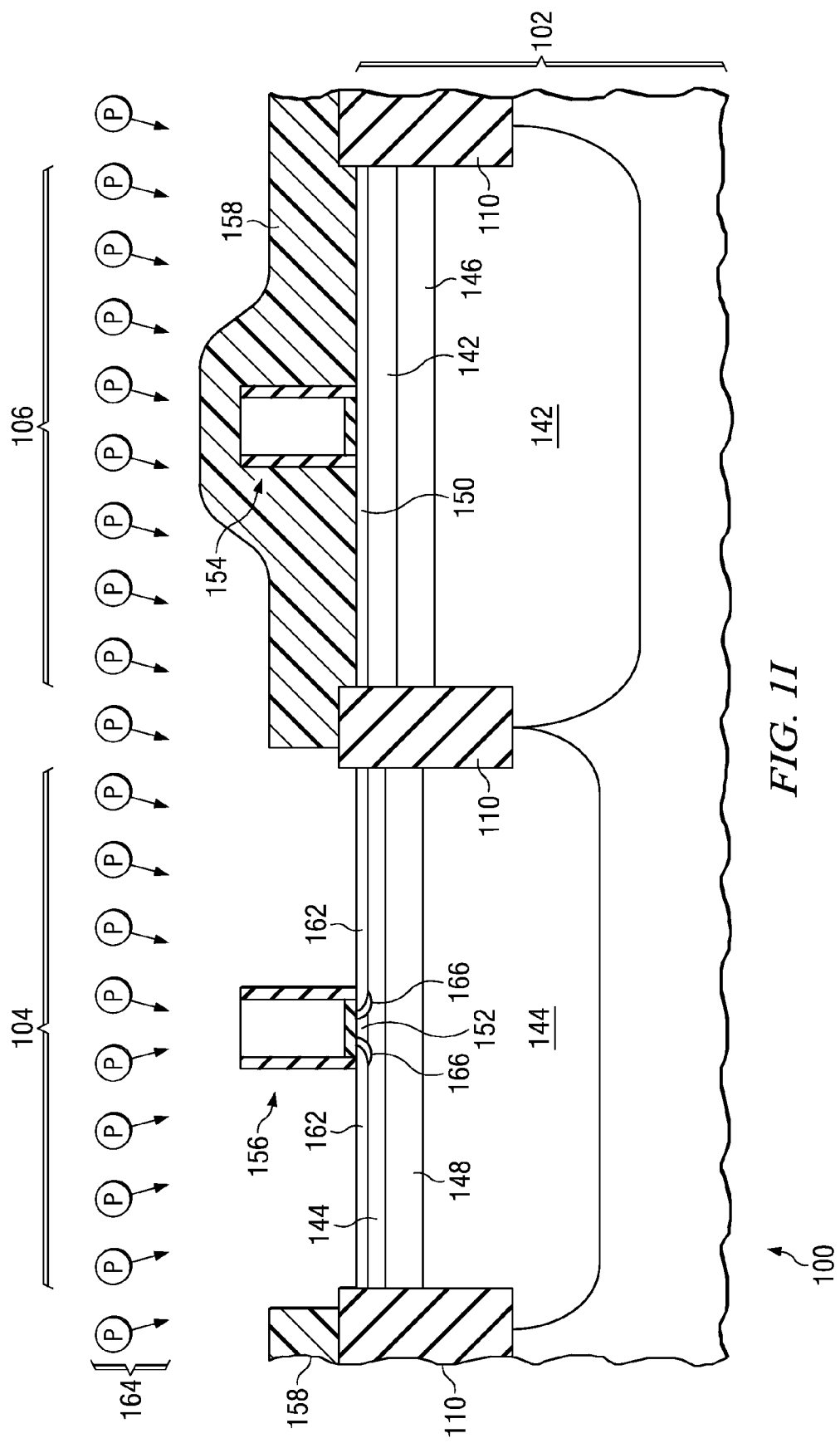

Referring to FIG. 1I, an optional NMOS halo implant operation may be performed which implants p-type NMOS halo dopants 164, for example boron at an energy of 6 to 9 keV, tilted at an angle of 20 to 35 degrees, into the substrate 102 under and adjacent to the NMOS gate structure 156 to form NMOS halo implanted regions 166 in the substrate 102 under the NMOS gate structure 156 abutting the NLDD implanted layers 162. The NMOS halo implant operation may use the NLDD implant mask 158 as an implant mask for the NMOS halo dopants 164. In one version of the instant embodiment, the NMOS anti-punch-through dopants 132 in the NMOS anti-punch-through implanted layer 134 may provide a majority of a desired dopant density distribution for a desired off-state current for the NMOS transistor, so that a total dose of the NMOS halo dopants 164 may be less than $2·10^{13}$ atoms/cm$^2$. In an alternate version of the instant embodiment, the NMOS anti-punch-through dopants 132 in the NMOS anti-punch-through implanted layer 134 may provide all of the desired dopant density distribution for the desired off-state current for the NMOS transistor, so that the NMOS halo implant operation is not performed.

Figure 1J:
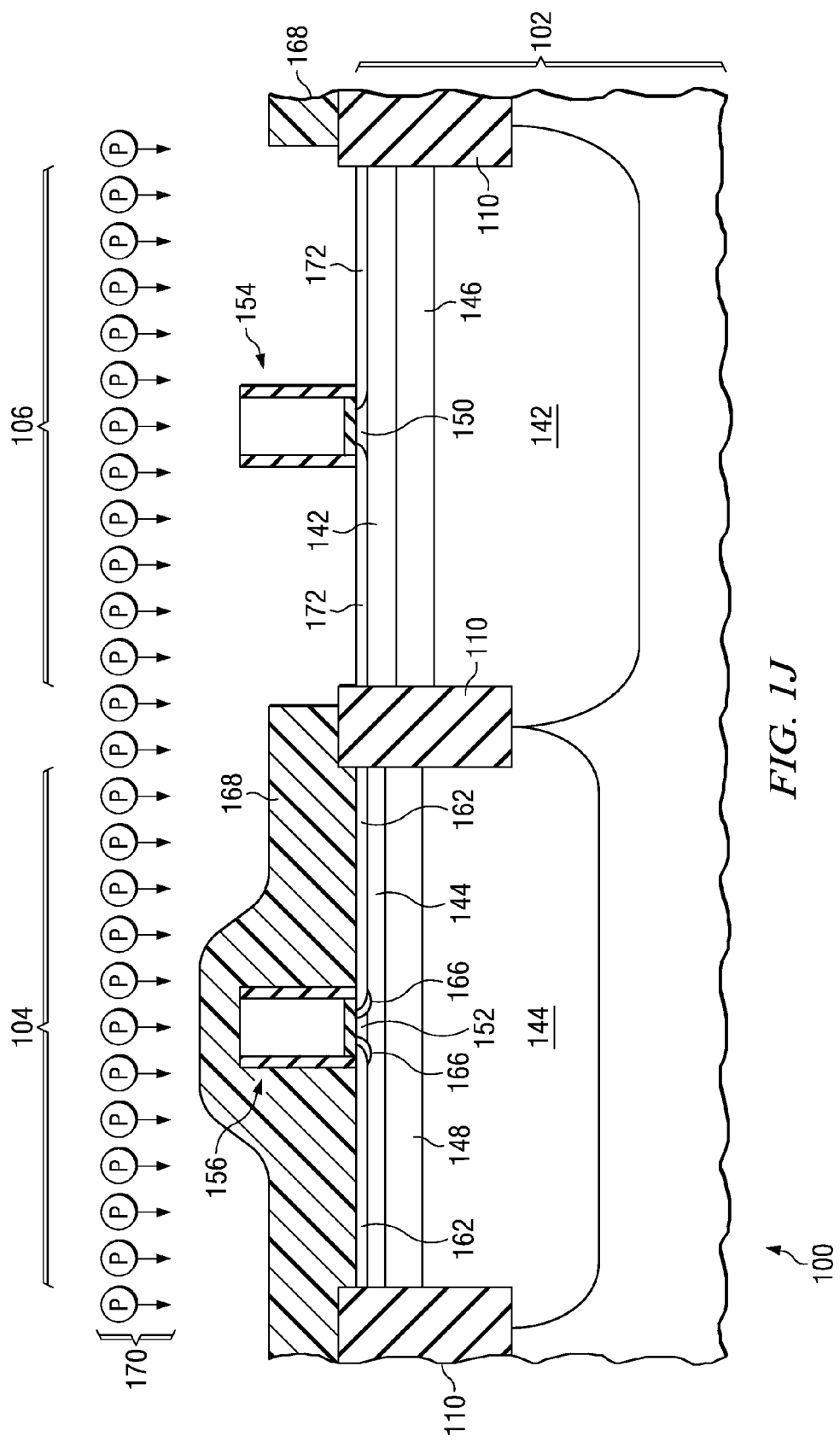

Referring to FIG. 1J, a p-channel lightly doped drain (PLDD) implant mask 168 is formed over the substrate and the NMOS gate structure 156 so as to expose the substrate 102 in the PMOS area 106 adjacent to the PMOS gate structure 154. A PLDD implant operation is performed which ion implants p-type PLDD dopants 170, for example BF$_2$ at a dose of $2·10^{14}$ to $6·10^{14}$ atoms/cm$^2$ at an energy of 2.5 to 4 keV, into the substrate 102 adjacent to the PMOS gate structure 154 to form PLDD implanted layers 172. Other species such as carbon may be implanted with the PLDD dopants 170 to provide desired dopant distributions in the PMOS transistor.

Figure 1K:
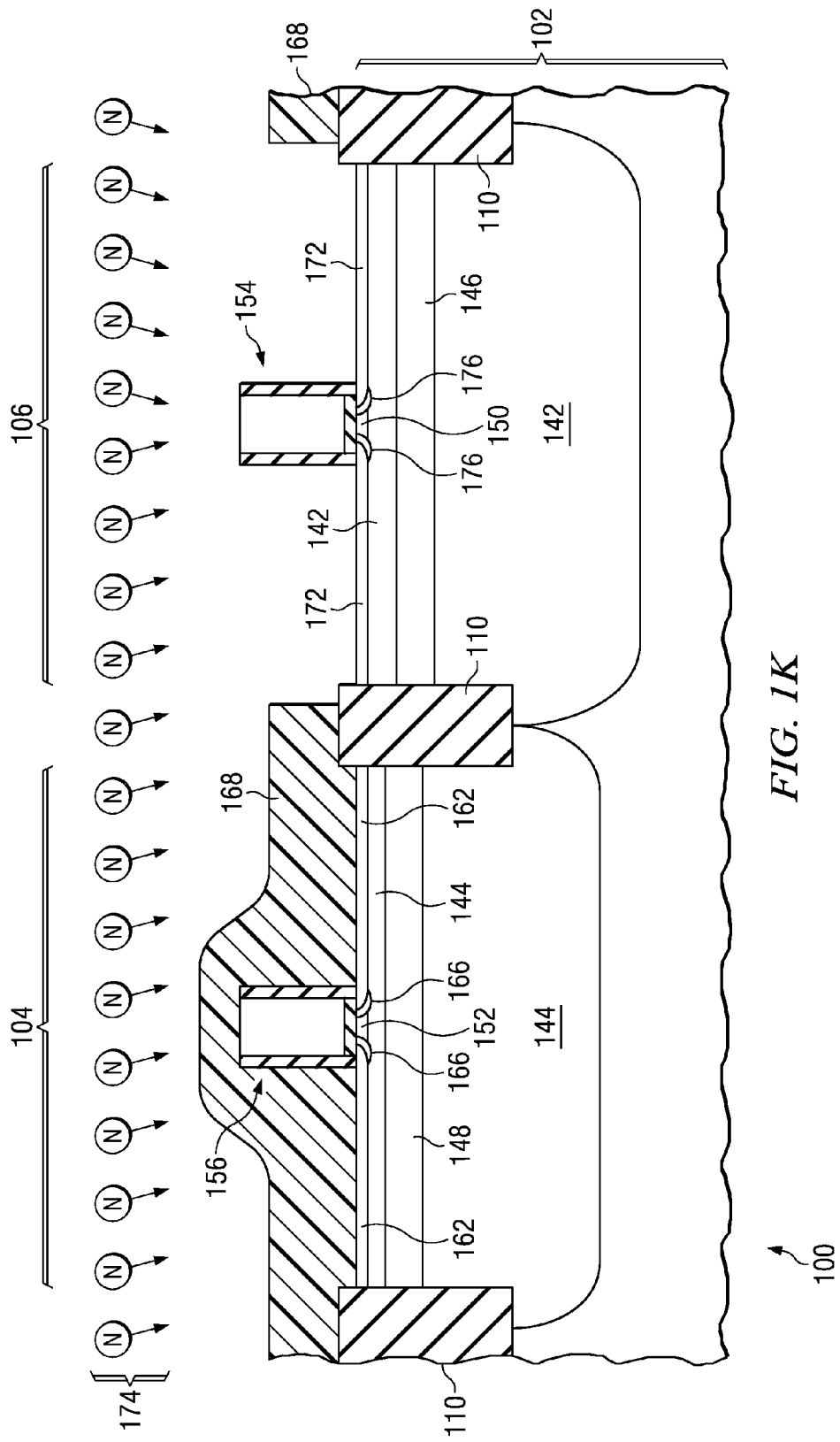

Referring to FIG. 1K, an optional PMOS halo implant operation may be performed which implants n-type PMOS halo dopants 174, for example arsenic at an energy of 40 to 55 keV, tilted at an angle of 20 to 30 degrees, into the substrate 102 under and adjacent to the PMOS gate structure 154 to form PMOS halo implanted regions 176 in the substrate 102 under the PMOS gate structure 156 abutting the PLDD implanted layers 172. The PMOS halo implant operation may use the PLDD implant mask 168 as an implant mask for the PMOS halo dopants 174. In one version of the instant embodiment, the PMOS anti-punch-through dopants 118 in the PMOS anti-punch-through implanted layer 120 may provide a majority of a desired dopant density distribution for a desired off-state current for the PMOS transistor, so that a total dose of the PMOS halo dopants 174 may be less than $1·10^{13}$ atoms/cm$^2$. In an alternate version of the instant embodiment, the PMOS anti-punch-through dopants 118 in the PMOS anti-punch-through implanted layer 120 may provide all of the desired dopant density distribution for the desired off-state current for the PMOS transistor, so that the PMOS halo implant operation is not performed.

It is within the scope of the instant embodiment to perform the NLDD implant operation, the NMOS halo implant operation, the PLDD implant operation and the PMOS halo implant operation in a different sequential order than that described above. Additional spacers may be formed on the PMOS gate structure 154 and/or the NMOS gate structure 156 between the NLDD implant operation and the PLDD implant operation.

Figure 1L:
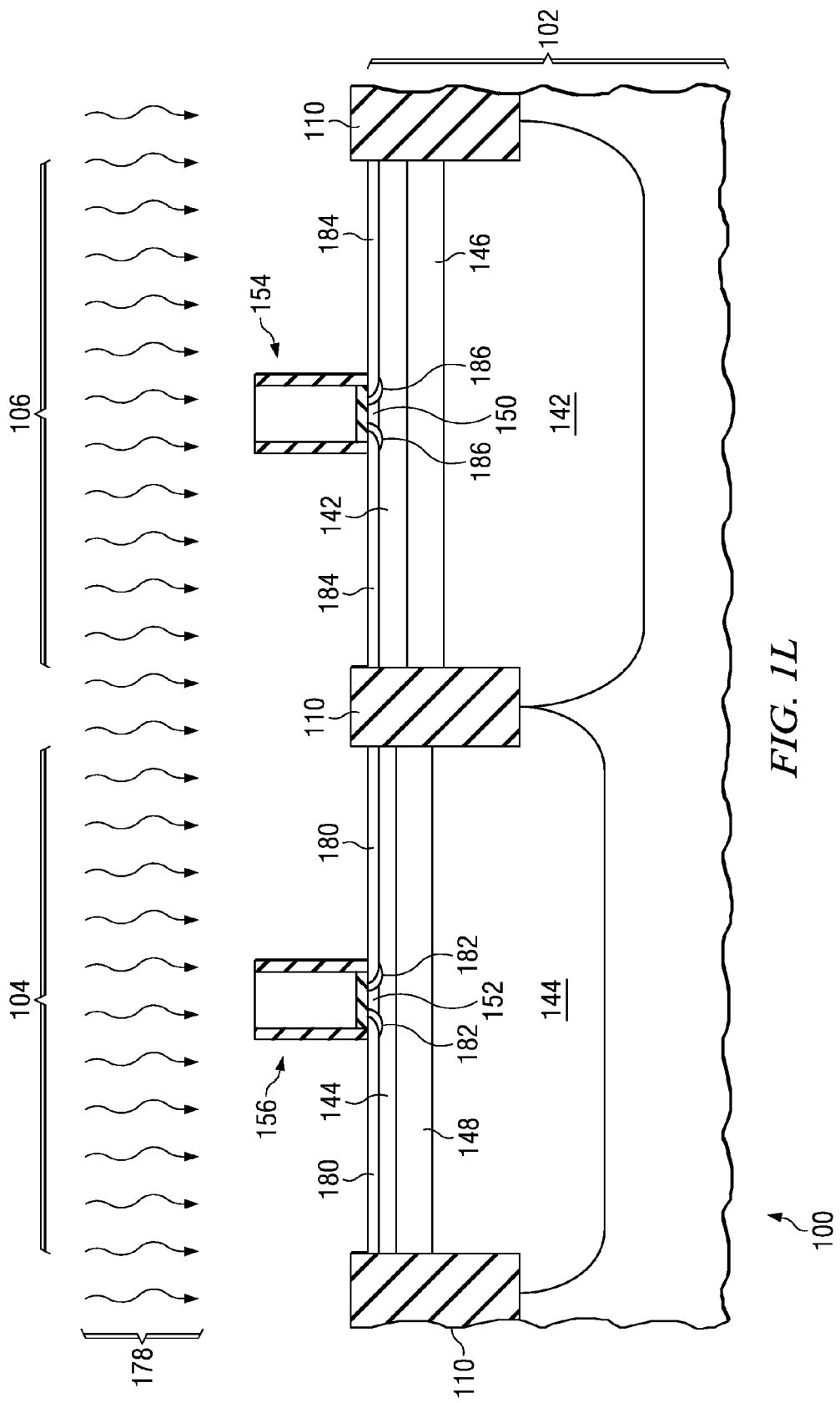

Referring to FIG. 1L, a lightly doped drain (LDD) anneal operation 178 is performed which activates and diffuses the implanted dopants described in reference to FIG. 1H through FIG. 1K. The LDD anneal operation 178 may, for example, heat the substrate 102 using radiant energy in a rapid thermal processor at anneal conditions, for example, 1000 C for 1.5 seconds to 925 C for 10 seconds, commonly referred to as a spike anneal. The LDD anneal operation 178 activates and diffuses the NLDD dopants 160 in the NLDD implanted layers 162 and the NMOS halo dopants 164 in the NMOS halo implanted regions 166 to form NLDD layers 180 in the substrate 102 adjacent to the NMOS gate structure 156 and NMOS halo regions 182 in the substrate 102 under the NMOS gate structure 156 abutting the NLDD layers 180, respectively. The LDD anneal operation 178 also activates and diffuses the PLDD dopants 170 in the PLDD implanted layers 172 and the PMOS halo dopants 174 in the PMOS halo implanted regions 176 to form PLDD layers 184 in the substrate 102 adjacent to the PMOS gate structure 154 and PMOS halo regions 186 in the substrate 102 under the PMOS gate structure 154 abutting the PLDD layers 184, respectively.

Figure 1M:
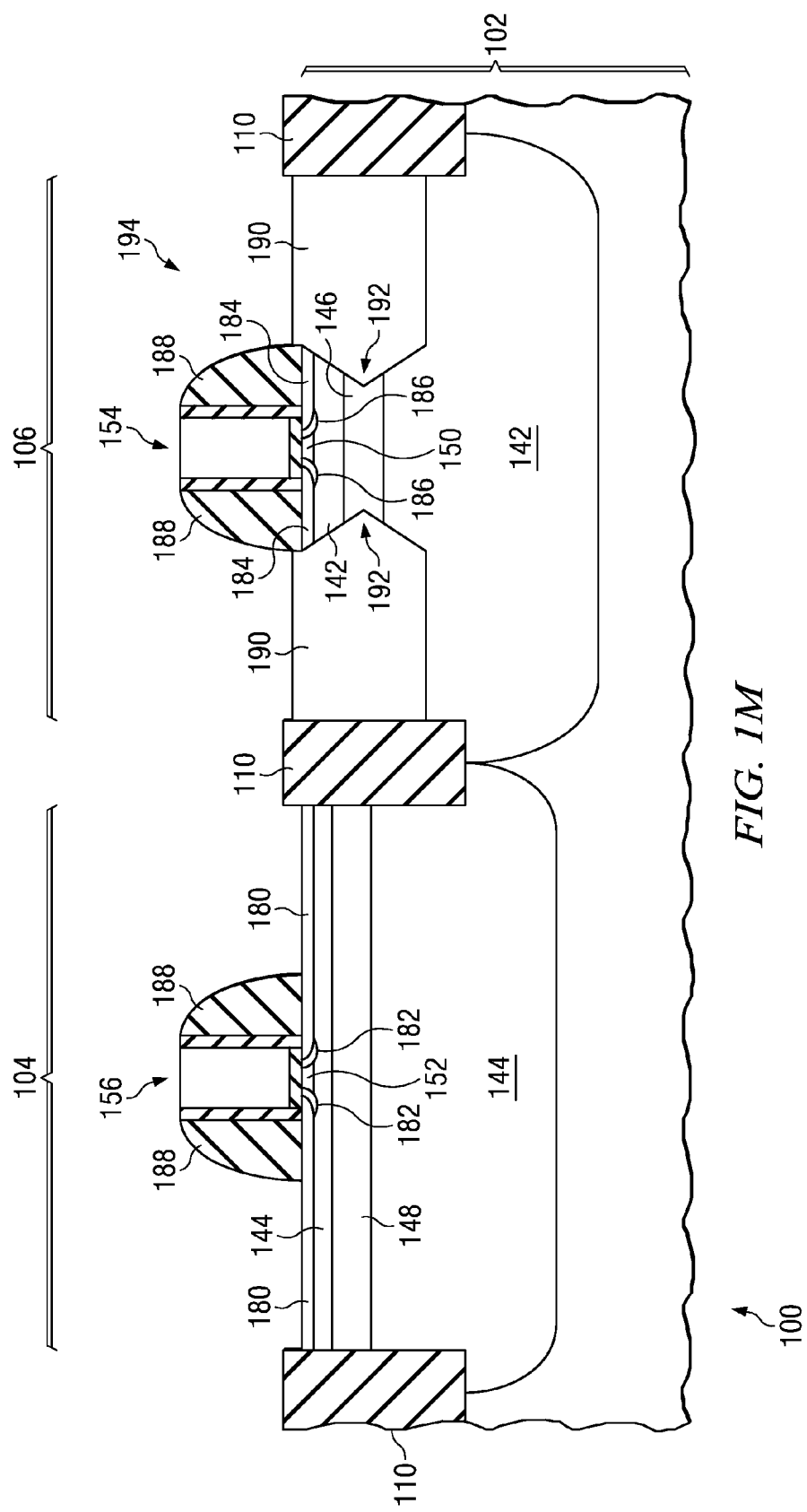

Referring to FIG. 1M, source drain epitaxial spacers 188 are formed abutting the NMOS gate structure 156 and the PMOS gate structure 154. The source drain epitaxial spacers 188 may be, for example, 20 to 50 nanometers wide at a bottom surface in contact with the substrate 102. The source drain epitaxial spacers 188 may include, for example, one or more layers of silicon nitride and/or silicon dioxide, and be formed by reaction of ammonia and bis(tertiary-butylamino) silane (BTBAS) and/or decomposition of tetraethyl orthosilicate, also known as tetraethoxysilane or TEOS, respectively.

P-type PMOS epitaxial source drain regions 190 are formed in the substrate 102 adjacent to the PMOS gate structure 154, extending under the source drain epitaxial spacers 188, culminating in PMOS stressor tips 192. The PMOS stressor tips 192 are furthest lateral extension of the PMOS epitaxial source drain regions 190 under the PMOS gate structure 154. The PMOS epitaxial source drain regions 190 may include, for example, silicon germanium, so as to increase lateral compressive stress in a channel of the PMOS transistor 194 to desirably increase an on-state current of the PMOS transistor 194. The PMOS epitaxial source drain regions 190 may be formed, for example, by etching PMOS source drain recesses in the substrate 102 followed by subsequent epitaxial growth of the PMOS epitaxial source drain regions 190.

The implant energy of the PMOS anti-punch-through implant operation was selected so that the PMOS anti-punch-through layer 146 extends above and below the PMOS stressor tips 192. A doping density of the PMOS anti-punch-through layer 146 increases a punch-through voltage of the PMOS transistor above the operating voltage of a drain node of the PMOS transistor 194 relative to a source node of the PMOS transistor 194. In one version of the instant embodiment, a peak doping density of the PMOS anti-punch-through layer 146 may be one and one-half to two times as high as the doping density at the top surface of the substrate 102 in the PMOS area 106, so as to provide a desired threshold voltage of the PMOS transistor. Including at least 50 percent antimony in the PMOS anti-punch-through dopants 118 may desirably reduce diffusion of the PMOS anti-punch-through dopants 118 during the well anneal and LDD anneal operations and subsequent thermal operations, compared to lighter n-type dopants such as phosphorus and arsenic.

Figure 1N:
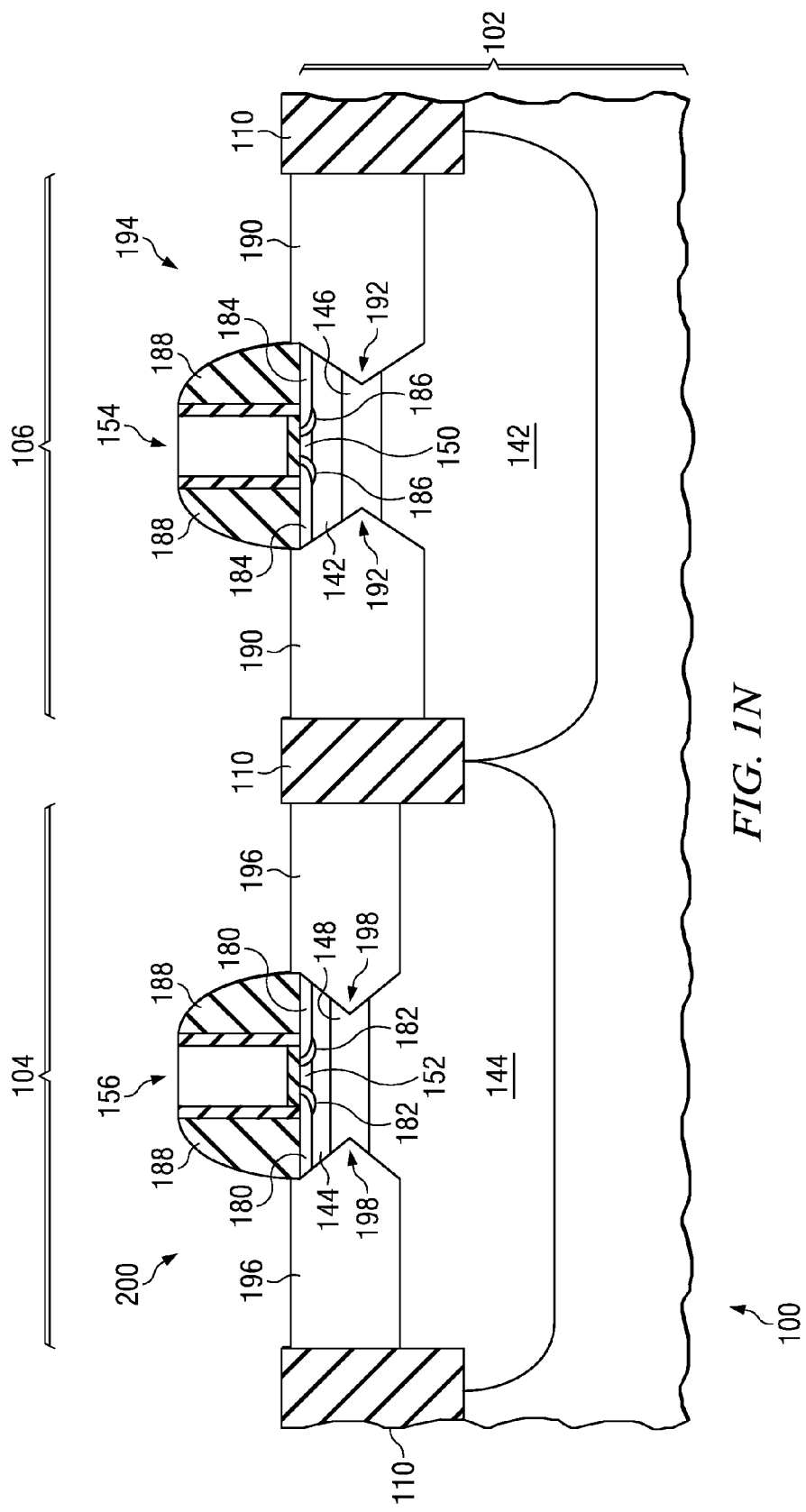
Figure 10:
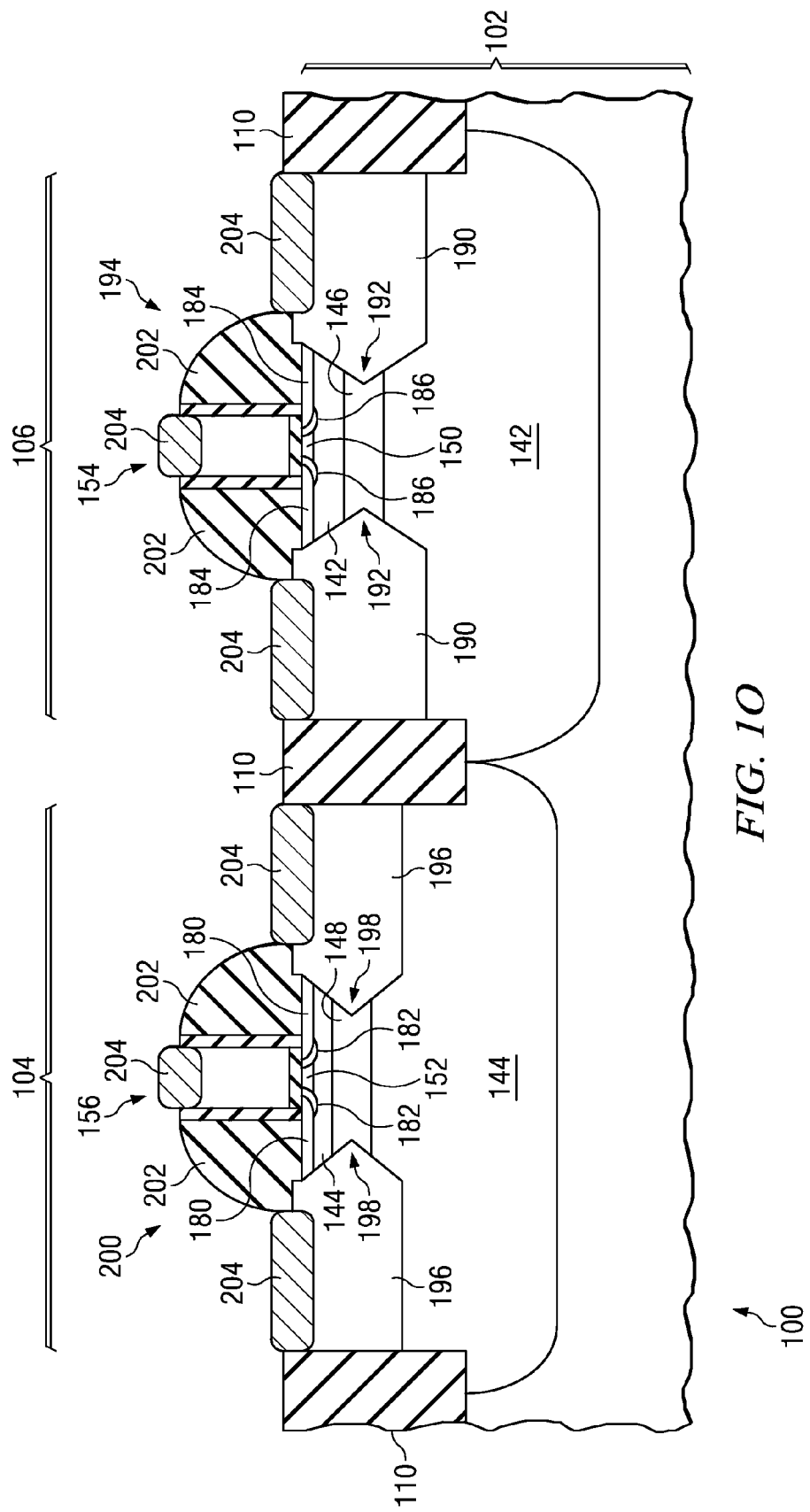

Referring to FIG. 1N, n-type NMOS epitaxial source drain regions 196 are formed in the substrate 102 adjacent to the NMOS gate structure 156, extending under the source drain epitaxial spacers 188, culminating in NMOS stressor tips 198. The NMOS stressor tips 198 are furthest lateral extension of the NMOS epitaxial source drain regions 196 under the NMOS gate structure 156. The NMOS epitaxial source drain regions 196 may include, for example, silicon carbide, so as to increase lateral tensile stress in a channel of the NMOS transistor to desirably increase an on-state current of the NMOS transistor. The NMOS epitaxial source drain regions 196 may be formed, for example, by a similar process sequence as the PMOS epitaxial source drain regions 190.

The implant energy of the NMOS anti-punch-through implant operation was selected so that the NMOS anti-punch-through layer 148 extends above and below the NMOS stressor tips 198. A doping density of the PMOS anti-punch-through layer 148 increases a punch-through voltage of the NMOS transistor above the operating voltage of the NMOS transistor drain node relative to the NMOS transistor source node. In one version of the instant embodiment, a peak doping density of the NMOS anti-punch-through layer 148 may be one and one-half to two times as high as the doping density at the top surface of the substrate 102 in the NMOS area 104, so as to provide a desired threshold voltage of the NMOS transistor. Including at least 50 percent indium in the NMOS anti-punch-through dopants 132 may desirably reduce diffusion of the NMOS anti-punch-through dopants 132 during the well anneal and LDD anneal operations and subsequent thermal operations, compared to lighter p-type dopants such as boron.

In an alternate version of the instant embodiment, only the PMOS transistor 194 may have epitaxial source drain regions. In a further version, only the NMOS transistor 200 may have epitaxial source drain regions.

Referring to FIG. 1O, the source drain epitaxial spacers 188 may be removed or reduced in size after formation of the PMOS epitaxial source drain regions 190 and the NMOS epitaxial source drain regions 196. Silicide spacers 202 are subsequently formed abutting the NMOS gate structure 156 and the PMOS gate structure 154. The silicide spacers 202 may possibly include portions of the source drain epitaxial spacers 188. The silicide spacers 202 are wider at a bottom surface than the source drain epitaxial spacers 188. The silicide spacers 202 may include one or more layers of silicon dioxide and/or silicon nitride, and be formed using similar processes to those described in reference to FIG. 1M.

Metal silicide layers 204 are formed at top surfaces of the PMOS epitaxial source drain regions 190 and the NMOS epitaxial source drain regions 196, and possibly at top surfaces of the PMOS gate structure 154 the NMOS gate structure 156. The metal silicide layers 204 may be formed, for example, depositing a layer of metal, such as nickel, on a top surface of the integrated circuit 100, heating the integrated circuit 100 to react a portion of the metal with exposed semiconductor material on the integrated circuit 100, and selectively removing unreacted metal from the integrated circuit 100 surface, commonly by exposing the integrated circuit 100 to wet etchants including a mixture of an acid and hydrogen peroxide.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a silicon-containing semiconductor substrate;
a first well of a first conductivity type disposed in said substrate;
a first gate structure disposed over said first well, said first gate structure including a first gate dielectric layer disposed on said substrate and a first gate electrode disposed over said gate dielectric layer;
first lightly doped drain (LDD) layers of a second conductivity type disposed in said first well adjacent to said first gate structure, said second conductivity type being an opposite polarity from said first conductivity type;
first epitaxial source drain regions of said second conductivity type disposed in said substrate adjacent to said first gate structure, said first epitaxial source drain regions extending under source drain epitaxial spacers abutting said first gate structure and culminating in first stressor tips, such that said first stressor tips are furthest lateral extension of said first epitaxial source drain regions under said first gate structure; and
a first anti-punch-through layer of said first conductivity type disposed in said first well under said first gate structure, so that said first anti-punch-through layer extends above and below said first stressor tips, said first anti-punch-through layer having an average doping density of $3 \cdot 10^{18}$ to $3 \cdot 10^{20}$ atoms/cm$^3$ and a peak doping density at least two times as high as a doping density at a top surface of said substrate under said first gate structure.

2. The integrated circuit of claim 1, in which:
said first conductivity type is n-type; and
said second conductivity type is p-type.

3. The integrated circuit of claim 2, in which said first epitaxial source drain regions include silicon germanium.

4. The integrated circuit of claim 2, in which dopants in said first anti-punch-through layer are antimony.

5. The integrated circuit of claim 1, in which:
said first conductivity type is p-type; and
said second conductivity type is n-type.

6. The integrated circuit of claim 5, in which said first epitaxial source drain regions include silicon carbide.

7. The integrated circuit of claim 6, in which dopants in said first anti-punch-through layer are indium.

8. The integrated circuit of claim 1, in which a thickness of said first anti-punch-through layer is less than one third of a depth of said first anti-punch-through layer in said substrate.

9. The integrated circuit of claim 1, including:
a second well of said second conductivity type disposed in said substrate in an area different from said first well;
a second gate structure disposed over said second, said second gate structure including a second gate dielectric layer disposed on said substrate and a second gate electrode disposed over said second gate dielectric layer;
second LDD layers of said first conductivity type disposed in said second well adjacent to said second gate structure;
second epitaxial source drain regions of said first conductivity type disposed in said substrate adjacent to said second gate structure, said second epitaxial source drain regions extending under source drain epitaxial spacers abutting said second gate structure and culminating in second stressor tips, such that said second stressor tips are furthest lateral extension of said second epitaxial source drain regions under said second gate structure; and
a second anti-punch-through layer of said second conductivity type disposed in said second well under said second gate structure, so that said second anti-punch-through layer extends above and below said second stressor tips, said second anti-punch-through layer having an average doping density of $3 \cdot 10^{18}$ to $3 \cdot 10^{20}$ atoms/cm$^3$ and a peak doping density at least two times as high as a doping density at a top surface of said substrate under said second gate structure.

10. A process of forming an integrated circuit, comprising the steps of:
providing a silicon-containing semiconductor substrate;
ion implanting well dopants of a first conductivity type into said substrate so as to form a first well of said first conductivity type in said substrate;
ion implanting first anti-punch-through dopants of said first conductivity type in said substrate so as to form a first anti-punch-through layer of said first conductivity type in said first well, said first anti-punch-through layer having an average doping density of $3 \cdot 10^{18}$ to $3 \cdot 10^{20}$ atoms/cm$^3$ and a peak doping density at least two times as high as a doping density at a top surface of said substrate under said first gate structure;
forming a first gate structure over said first well, said first gate structure including a first gate dielectric layer disposed on said substrate and a first gate electrode disposed over said first gate dielectric layer;
ion implanting first LDD dopants of a second conductivity type in said substrate adjacent to said first gate structure so as to form first LDD layers of said second conductivity type in said substrate adjacent to said first gate structure, said second conductivity type being an opposite polarity from said first conductivity type; and
forming first epitaxial source drain regions of said second conductivity type in said substrate adjacent to said first gate structure, said first epitaxial source drain regions extending under source drain epitaxial spacers abutting said first gate structure and culminating in first stressor tips, such that:
said first stressor tips are furthest lateral extension of said first epitaxial source drain regions under said first gate structure; and
said first anti-punch-through layer extends above and below said first stressor tips.

11. The process of claim 10, in which:
said first conductivity type is n-type; and
said second conductivity type is p-type.

12. The process of claim 11, in which said first epitaxial source drain regions include silicon germanium.

13. The process of claim 11, in which said first anti-punch-through dopants are antimony.

14. The process of claim 10, in which:
said first conductivity type is p-type; and
said second conductivity type is n-type.

15. The process of claim 14, in which said first epitaxial source drain regions include silicon carbide.

16. The process of claim 14, in which said first anti-punch-through dopants are indium.

17. The process of claim 10, in which a thickness of said first anti-punch-through layer is less than one third of a depth of said first anti-punch-through layer in said substrate.

18. The process of claim 10, including the step of ion implanting first halo dopants of said first conductivity type, tilted at an angle of 20 to 35 degrees, into said substrate under and adjacent said first gate structure so as to form first halo regions of said first conductivity type in said substrate under said first gate structure abutting said first LDD layers.

19. The process of claim 10, further including the step of performing a well anneal operation after said step of ion implanting said first anti-punch-through dopants, said well anneal operation including a step of heating said substrate to a temperature of 1000° C. to 1350° C. for 100 microseconds to 10 milliseconds.

20. The process of claim 10, including the steps of:
ion implanting second well dopants of said second conductivity type into said substrate so as to form a second well of said second conductivity type in said substrate in an area different from said first well;
ion implanting second anti-punch-through dopants of said second conductivity type into said substrate so as to form a second anti-punch-through layer of said second conductivity type in said second well, said second anti-punch-through layer having an average doping density of $3 \cdot 10^{18}$ to $3 \cdot 10^{20}$ atoms/cm$^3$ and a peak doping density at least two times as high as a doping density at a top surface of said substrate under said second gate structure;
forming a second gate structure over said second well, said second gate structure including a second gate dielectric layer disposed on said substrate and a second gate electrode disposed over said second gate dielectric layer;
ion implanting second LDD dopants of said first conductivity type into said substrate adjacent to said second gate structure so as to form second LDD layers of said first conductivity type in said substrate adjacent to said second gate structure;
forming second epitaxial source drain regions of said first conductivity type in said substrate adjacent to said second gate structure, said second epitaxial source drain regions extending under source drain epitaxial spacers abutting said second gate structure and culminating in second stressor tips, such that:
said second stressor tips are furthest lateral extension of said second epitaxial source drain regions under said second gate structure; and
said second anti-punch-through layer extends above and below said second stressor tips.

* * * * *